(12) United States Patent
Cho et al.

(10) Patent No.: US 7,999,399 B2
(45) Date of Patent: Aug. 16, 2011

(54) OVERLAY VERNIER KEY AND METHOD FOR FABRICATING THE SAME

(75) Inventors: Byeong Ho Cho, Icheon-si (KR); Sung Woo Ko, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 642 days.

(21) Appl. No.: 11/618,687

(22) Filed: Dec. 29, 2006

(65) Prior Publication Data

US 2008/0003705 A1 Jan. 3, 2008

(30) Foreign Application Priority Data

Jun. 28, 2006 (KR) .................. 10-2006-0058932

(51) Int. Cl.
*H01L 23/544* (2006.01)
(52) U.S. Cl. ............. 257/797; 257/635; 257/E23.179; 430/5; 430/22; 430/30
(58) Field of Classification Search .......... 257/797, 257/E23.179, 635; 430/22, 5, 30
See application file for complete search history.

(56) References Cited

U.S. PATENT DOCUMENTS

| 2003/0174879 A1 | 9/2003 | Chen |
| 2006/0263706 A1 | 11/2006 | Yim |

FOREIGN PATENT DOCUMENTS

| KR | 10-2000-0040106 A | 7/2000 |
| KR | 10-2003-0089911 A | 11/2003 |
| KR | 10-2004-0003936 A | 1/2004 |

*Primary Examiner* — Jack Chen
(74) *Attorney, Agent, or Firm* — Kilpatrick Townsend & Stockton LLP

(57) ABSTRACT

An overlay vernier key includes a semiconductor substrate on which a cell region and a scribe lane region are defined, and a plurality of vernier patterns which are formed in the scribe lane region of the semiconductor substrate and arranged in a polygonal shape. Each of the vernier patterns has a hollow polygonal shape.

5 Claims, 6 Drawing Sheets

Cell | Scribe Lane

Cell | Scribe Lane

Cell | Scribe Lane

Cell | Scribe Lane

//+ # OVERLAY VERNIER KEY AND METHOD FOR FABRICATING THE SAME

CROSS-REFERENCE TO RELATED APPLICATION

The present application claims priority to Korean patent application No. 10-2006-0058932, filed on Jun. 28, 2006, which is incorporated herein by reference in its entirety.

BACKGROUND OF THE INVENTION

The present invention relates to a semiconductor device, and more particularly to an overlay vernier key and a method for fabricating the same.

In manufacturing a semiconductor device having a laminate structure, an overlay is an index indicating an alignment state between a layer formed in a previous process and a layer formed in a current process. The overlay is very important when developing a highly integrated semiconductor device. In order to detect and correct the alignment state between the layer formed in the previous process and the layer formed in the current process, the overlay between the layers are measured by forming an overlay vernier key in a scribe lane region. The overlay vernier key is a pattern which is formed for aligning an exposure mask at an accurate position when forming a predetermined pattern on a semiconductor substrate. The overlay vernier key is formed simultaneously with a pattern formed in a device forming region.

FIG. 1A is a schematic view showing a conventional structure of an overlay vernier key. FIG. 1B illustrates an overlay measuring signal detected when measuring a conventional overlay vernier key.

Referring to FIG. 1A, an overlay vernier key 10 has a box-shaped pattern. The overlay vernier key 10 has a larger size and pitch than a pattern formed in a cell region. In a highly integrated device, a margin is decreased and the overlay vernier key 10 does not have a sufficient line width. Thus, it is difficult to measure the overlay with optical overlay measuring equipment and to form a micro pattern in the cell region.

A Spacer Double Exposure Technique (SDET) is a method for forming the micro pattern under 60 nm on a wafer "w" (see FIG. 1B). The SDET method includes the steps of forming a dummy pattern on a substrate, forming an etch mask having a spacer shape at a side surface of the dummy pattern, removing the dummy pattern, and forming the micro pattern and overlay vernier key using the etch mask.

As shown in FIG. 1B, when forming the overlay vernier key 20 using the SDET method, the spacer-shaped etch mask is formed at a sidewall of the dummy pattern (not shown) in a scribe lane region, which is larger than the cell region. The size of the etch mask in the scribe lane region is same as that of the etch mask in the cell region. The overlay vernier key 20 formed by using the etch mask has a line width which is much larger than a proper line width. As seen in FIG. 1B, because the overlay measuring signal is too weak to be detected by the optical overlay measuring equipment, the optical overlay measuring equipment cannot perceive a contrast difference. If the overlay vernier key 20 is formed to have a thickness large enough to be measured by the optical overlay measuring equipment, there may be a problem caused by a difference between the size of the overlay vernier key 20 and the size of the pattern in the cell region. Therefore, the overlay vernier key is required to have a structure adequately sized to be measured by the optical overlay measuring equipment.

SUMMARY OF THE INVENTION

An embodiment of the present invention provides an overlay vernier key and another embodiment provides a method for fabricating the overlay vernier key. A vernier key of the present embodiment provides a precise overlay measurement and overlay correction.

In one embodiment, A semiconductor substrate defining an overlay vernier key, the substrate comprising: a cell region and a scribe lane region defined on the substrate; and a plurality of vernier patterns formed in the scribe lane region of the substrate and arranged to form a shape, each of the vernier patterns having a hollow shape.

Preferably, The plurality of vernier patterns are proximately arranged so as to generate a signal strong enough to be detected by overlay measuring equipment.

Preferably, The shape formed by the plurality of vernier patterns is a polygonal shape, the hollow shape of each vernier pattern being a hollow polygonal shape.

Preferably, The vernier patterns have the same size and pitch as patterns formed in the cell region.

In another embodiment, a method for fabricating an overlay vernier key comprises laminating a pattern layer and an insulating layer sequentially on a semiconductor substrate on which a cell region and a scribe lane region are defined. Insulating layer patterns are formed by patterning the insulating layer to partially expose the pattern layer. Spacer-shaped etch masks are formed such that the insulating layer and an etch selectivity are formed at both side surfaces of the insulating layer patterns. The insulating layer patterns are removed. Vernier patterns are formed in a hollow polygonal shape by etching the pattern layer and using the etch masks as a hard mask.

Preferably, the vernier patterns are arranged in alignment with each other on the semiconductor substrate to form sides of a polygon-shaped structure, and proximately arranged so as to generate a signal strong enough to be detected by overlay measuring equipment.

Preferably, the insulating layer may include an oxide layer, and the pattern layer may include a conductive material.

Preferably, the insulating layer may be removed by wet etching.

Preferably, the etch masks may be formed to have a same thickness in the cell region and the scribe lane region.

BRIEF DESCRIPTION OF THE DRAWINGS

The above and other embodiments, features and other advantages of the present invention will be more clearly understood from the following detailed description taken in conjunction with the accompanying drawings, in which.

DESCRIPTION OF SPECIFIC EMBODIMENTS

Figure 1A:
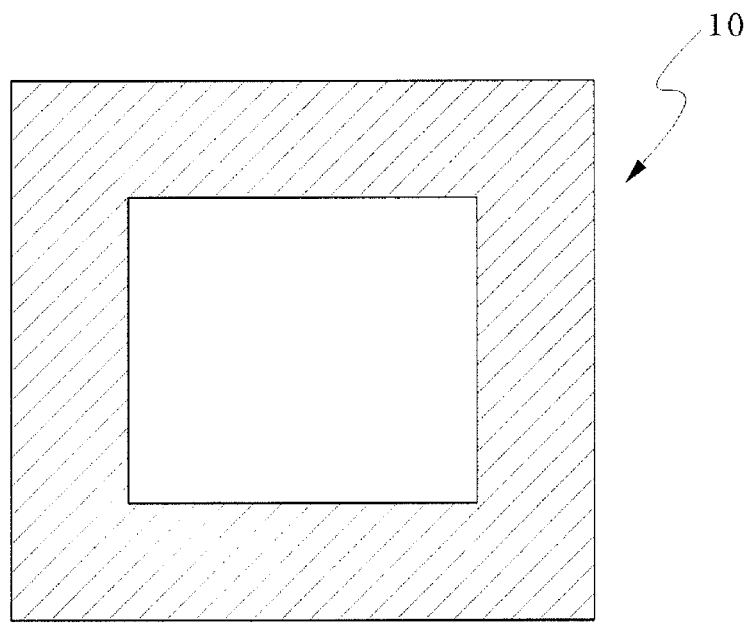
FIG. 1A is a schematic view showing a structure of a conventional vernier key.
Figure 1B:
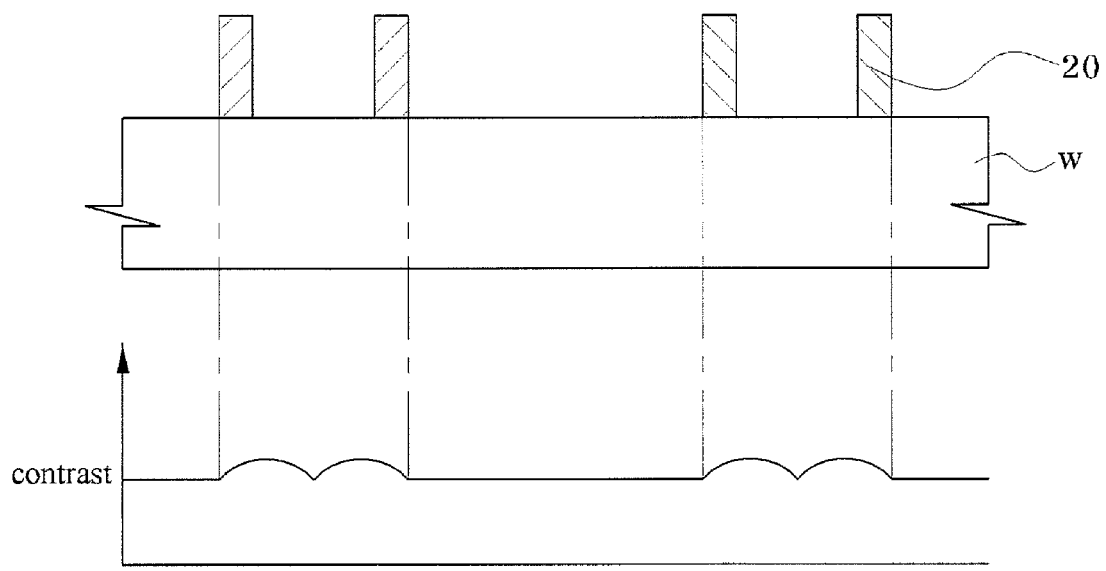
FIG. 1B is a graph showing an overlay measuring signal detected when measuring a conventional overlay vernier key.

Embodiments of the present invention will be described in detail with reference to the accompanying drawings. In the drawings, thicknesses of layers and regions are magnified to provide clear illustration. In the following description, the same or similar elements are denoted by the same reference numerals even though they are depicted in different drawings.

Figure 2:
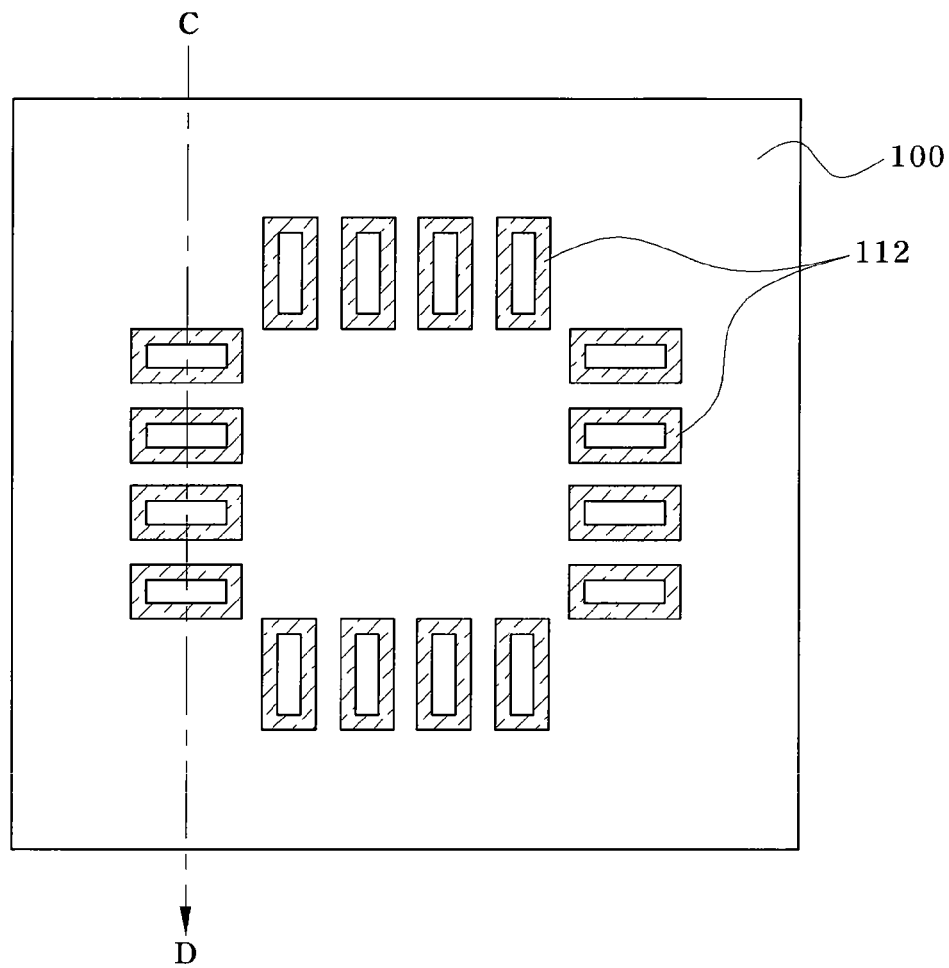
FIG. 2 is a plan view showing a structure of an overlay vernier key in accordance with a preferred embodiment of the present invention.

Referring to FIG. 2, an overlay vernier key of the present invention has a box-shaped key structure having a plurality of vernier patterns 112 arranged in a polygonal (e.g., rectangular) shape.

The plurality of vernier patterns 112 are arranged in alignment with each other with a gap defined therebetween to form sides of the polygon-shaped key structure. Each of the vernier patterns 112 may be formed with a hollow rectangular shape. The plurality of vernier patterns 112 are proximately arranged to generate a signal strong enough to be detected by an optical overlay measuring equipment.

Figure 3:
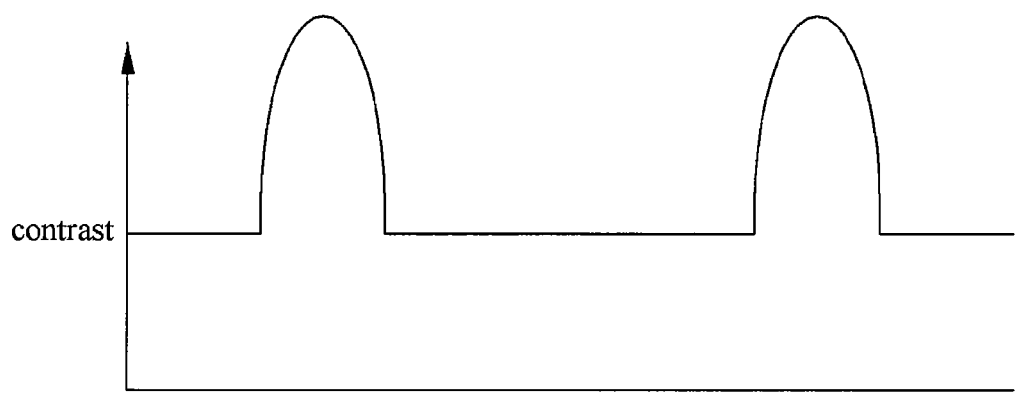
FIG. 3 is a graph showing an overlay measuring signal detected when measuring an overlay vernier key in accordance with a preferred embodiment of the present invention.

The close arrangement of the vernier patterns 112 is necessary because each of the vernier patterns 112 has a small dimension such that the signal cannot be detected by the optical overlay measuring equipment. In the present invention, since the plurality of vernier patterns 112 are arranged close together, a strong signal is generated (shown in FIG. 3) such that the overall shape of the overlay vernier key can be measured. The measurement of the overlay measuring equipment is performed along a C-D axis (shown in FIG. 2) on the side of the polygon-shaped key structure. Preferably, the vernier patterns 112 include a conductive material so as to be easily measured by the overlay measuring equipment. It is preferable that the gap between two adjacent vernier patterns 112 is set to have a magnitude capable of generating a constructive interference between light for measuring the overlay related to the respective vernier patterns 112.

The vernier patterns 112 have the same size and pitch as the patterns formed in a cell region. Accordingly, such an overlay vernier key structure may prevent a reading error which may occur by a difference in size of the vernier patterns 112 and the patterns formed in the cell region. As a result, a more precise overlay measurement and overlay correction can be achieved.

FIGS. 4A to 7B are views illustrating a method for fabricating the overlay vernier key according to the present invention. Specifically, FIGS. 4B, 5B, 6B and 7B are plan views for illustrating a scribe lane region in FIGS. 4A, 5A, 6A and 7A, respectively.

Figure 4A:
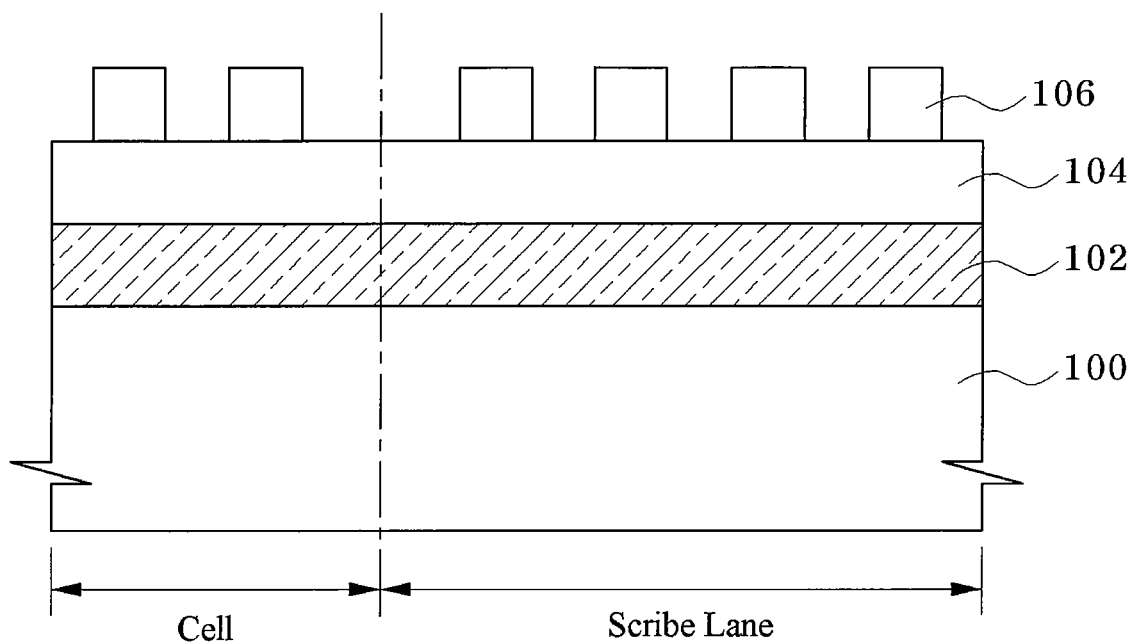
FIGS. 4A to 7B are views illustrating a method for fabricating an overlay vernier key in accordance with a preferred embodiment of the present invention.
Figure 4B:
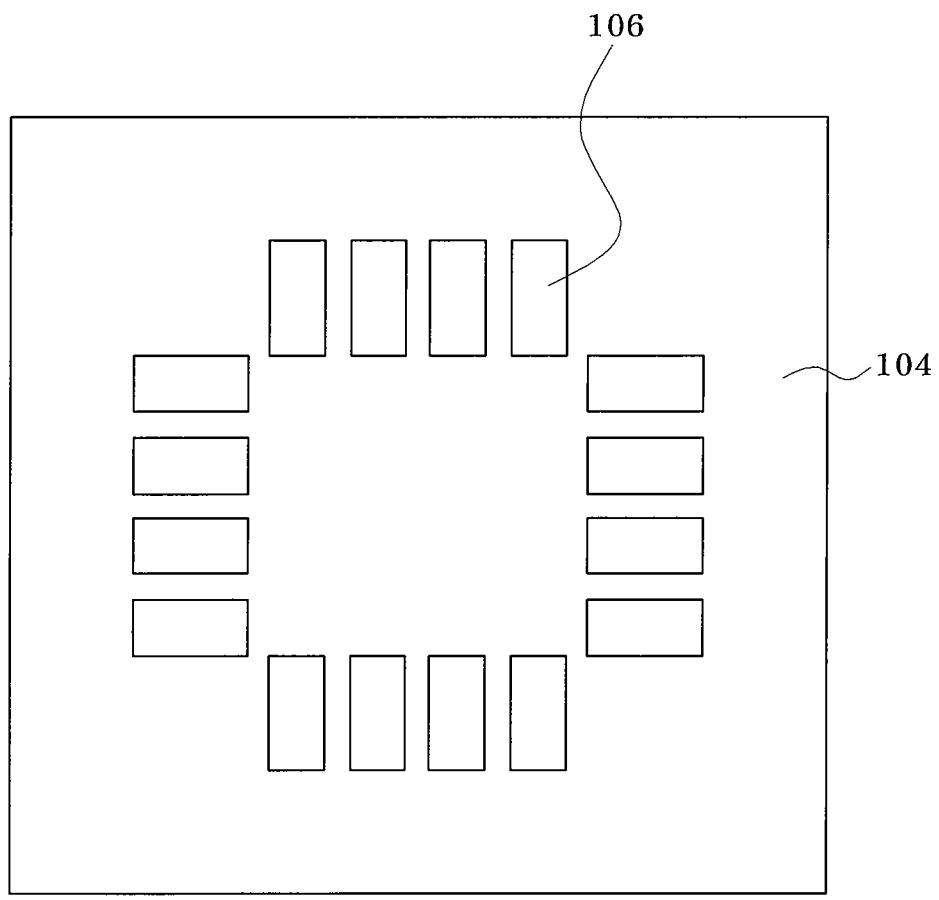

Referring to FIGS. 4A and 4B, a pattern layer 102 and an insulating layer 104 are deposited sequentially over a wafer or a semiconductor substrate 100, on which a cell region and a scribe lane region are defined. Photoresist layer patterns 106 are formed by coating a photoresist layer over the insulating layer 104 and patterning the same. The photoresist layer patterns 106 define a region where vernier patterns are formed during a process of forming an overlay vernier key in the scribe lane region. The pattern layer 102 includes a conductive material so as to be easily measured by the overlay measuring equipment. Although it is not illustrated in the drawings, the photoresist layer patterns are arranged along a line in the cell region. As shown in FIG. 4B, the photoresist layer patterns 106 are arranged in a polygonal (e.g., rectangular) shape in the scribe lane region. In one embodiment, the insulating layer 104 may include an oxide layer.

Figure 5A:
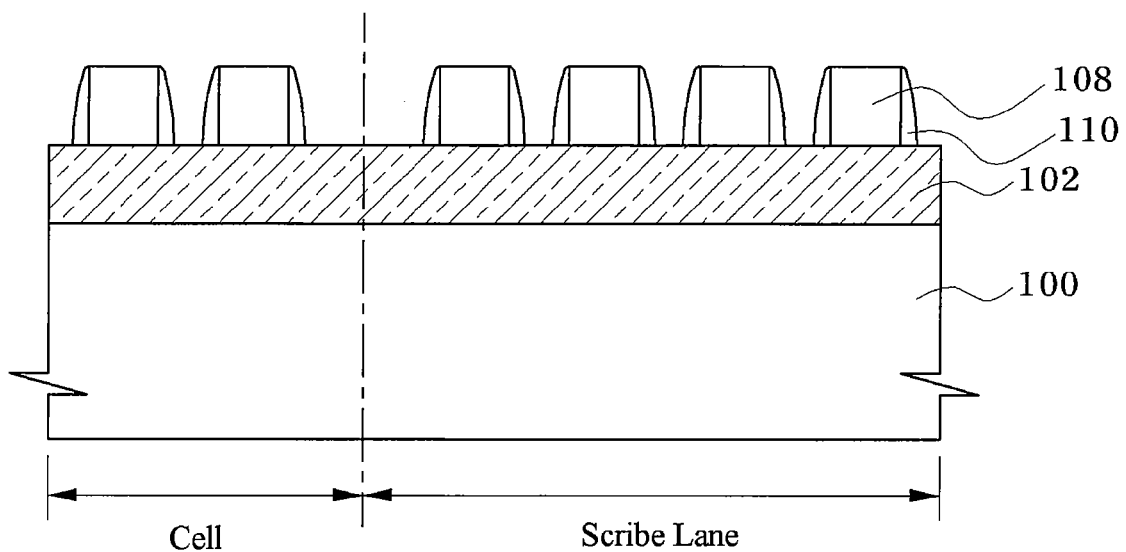
Figure 5B:
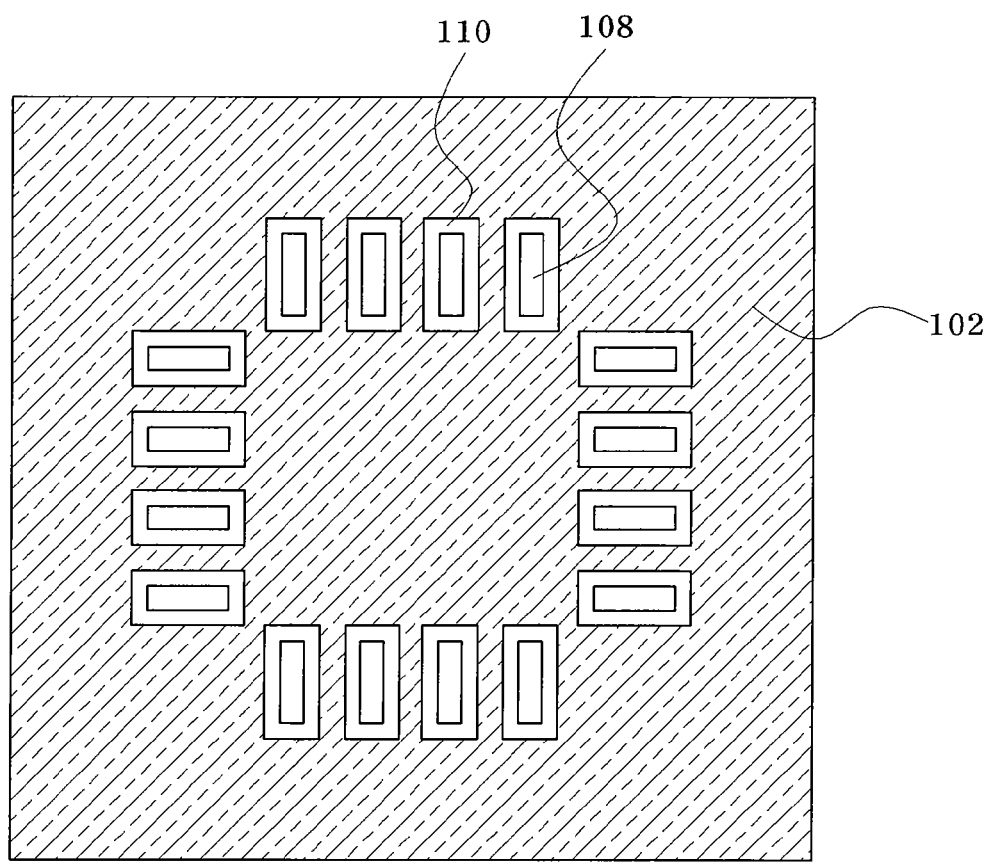

Referring to FIGS. 5A and 5B, the insulating layer is etched using the photoresist layer patterns 106 as a mask, to form insulating layer patterns 108. The pattern layer 102 is partially exposed by the insulating layer patterns 108. Etch masks 110 are formed in a spacer shape, and surround the exposed surfaces of the insulating layer patterns 108. The etch masks 110 include the insulating layer and a material having an etch selectivity (e.g., a nitride layer).

The etch masks 110 are formed on the front surface of the semiconductor substrate 100 including the insulating layer patterns 108. By performing a spacer etching process, such as an "etch back", the etch masks 110 are formed in a spacer shape to surround the exposed surfaces of the insulating layer patterns 108.

The etch masks 110 function as a hard mask layer in the etching process for forming the vernier patterns. It is preferable that the etch masks 110 are formed to have the same thickness in the cell region and the scribe lane region.

Figure 6A:
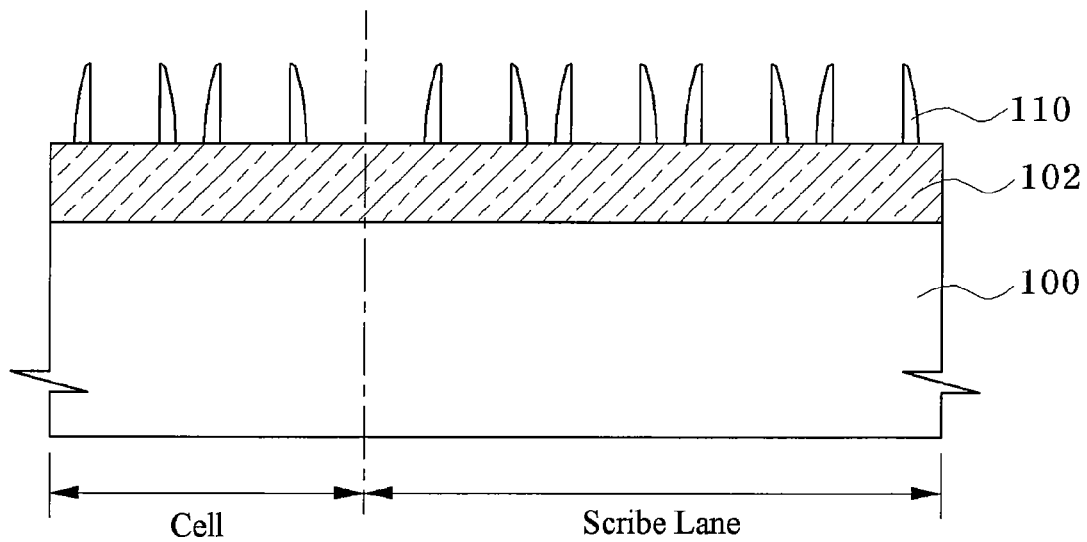
Figure 6B:
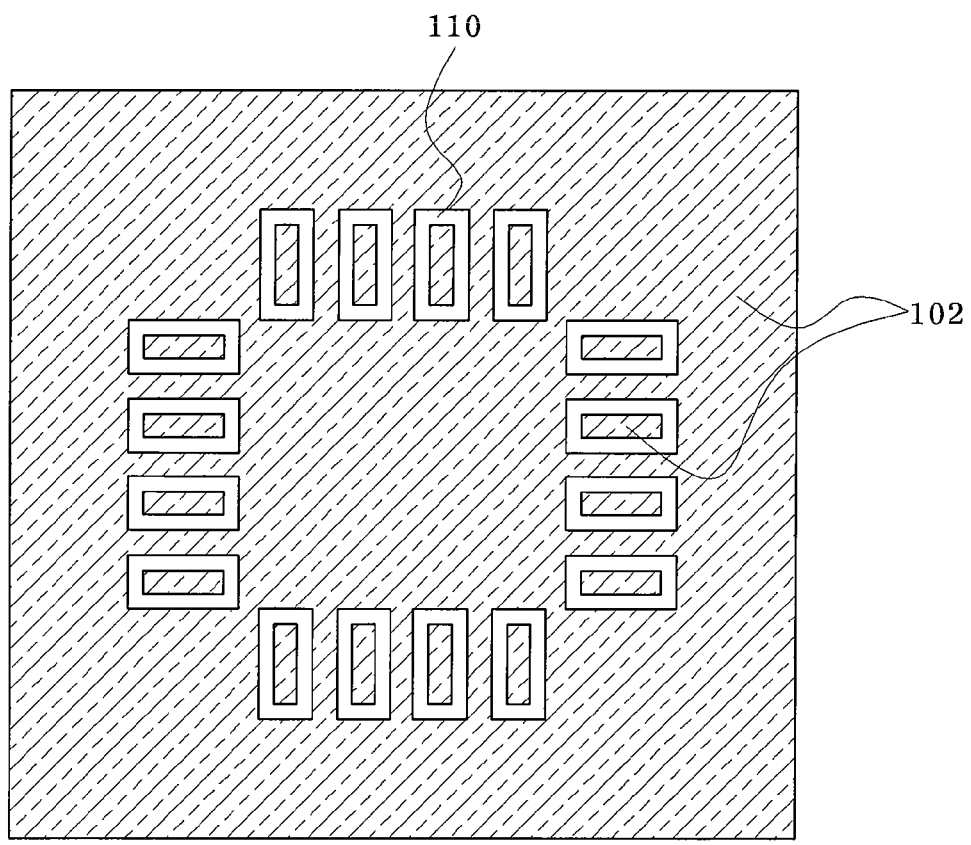

Referring to FIGS. 6A and 6B, the insulating layer patterns 108, except the etch masks 110, are removed. The insulating layer patterns 108 may be removed using wet etching. Because the etch masks 110 have a higher etch selectivity than the insulating layer, the etch masks 110 are not removed. By such an etching process, as shown in FIG. 6B, the pattern layer 102 is exposed, and the etch masks 110 remain to form a hollow polygonal (e.g., rectangular) shape.

Figure 7A:
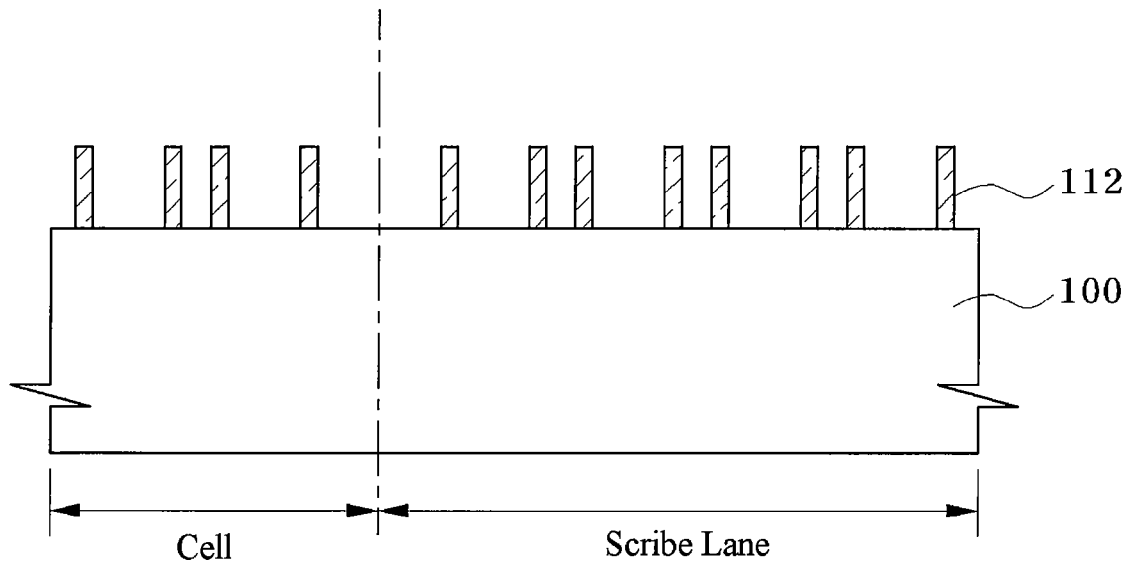
Figure 7B:
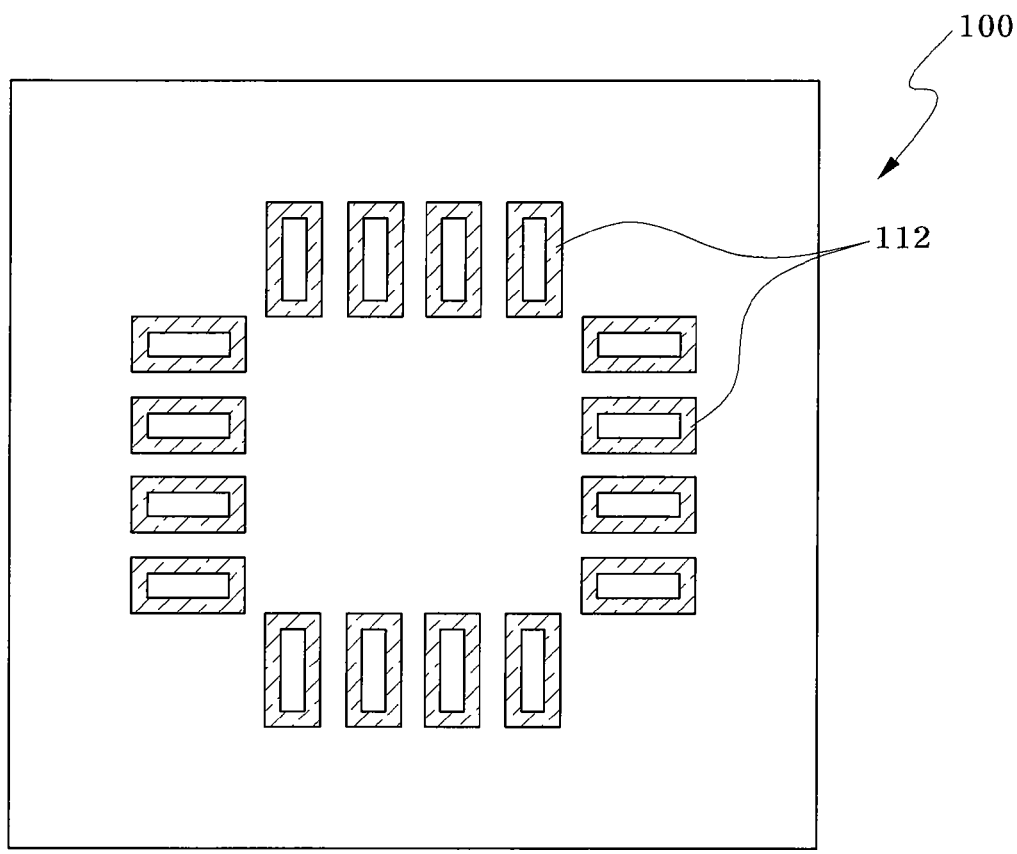

Referring to FIGS. 7A and 7B, by etching the pattern layer 102 while using the etch masks 110 as the hard mask, an overlay vernier key is formed with a plurality of vernier patterns 112. The overlay vernier key is formed to have a box-shaped key structure. In other words, as shown in FIG. 7B, the plurality of vernier patterns 112 are arranged in alignment with each other with a gap defined therebetween to form sides of the polygon-shaped (e.g., rectangle-shaped) key structure. Each of the vernier patterns 112 is formed with a hollow polygonal (e.g., rectangular) shape.

The plurality of vernier patterns 112 is proximately arranged so as to generate a signal strong enough to be detected by the optical overlay measuring equipment.

Arranging the vernier patterns 112 to be close together is necessary because each individual vernier pattern is too small to generate a signal that can be detected by the optical overlay measuring equipment. In the present invention, since the plurality of vernier patterns 112 are arranged close together, a detectable signal is generated (shown in FIG. 3) by which the overall shape of the overlay vernier key can be measured by the overlay measuring equipment along the C-D axis (see FIG. 2) on the side of the polygon-shaped key structure.

It is preferable that the gap between two adjacent vernier patterns 112 is defined to have a magnitude capable of generating a constructive interference between light for measuring the overlay related to the respective vernier patterns 112. The vernier patterns 112 have the same size and pitch as the patterns formed in the cell region.

As is apparent from the above description, according to the overlay vernier key and the method for forming the same of the present invention, a reading error which may occur by a difference in size of the vernier patterns and the patterns formed in the cell region is prevented. Accordingly, a more precise overlay measurement and overlay correction can be achieved.

Although the specific embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor device defining an overlay vernier key, the semiconductor device comprising:
   a cell region and a scribe lane region defined over a substrate; and
   a plurality of rectangular rings formed in the scribe lane region of the substrate and arranged to form sides of a polygon shape, wherein at least one of the rectangular rings exposes a surface of the substrate at an inner open region of the rectangular ring.

2. The semiconductor device of claim 1, wherein the plurality of rectangular rings are proximately arranged so as to generate a signal strong enough to be detected by overlay measuring equipment.

3. The semiconductor device claim 1, wherein the rectangular rings have the same size and pitch as patterns formed in the cell region.

4. The semiconductor device of claim 1, wherein each of at least two of the rectangular rings exposes a surface of the substrate at an inner open region of the rectangular ring.

5. The semiconductor device of claim 4, wherein each of the rectangular rings exposes a surface of the substrate at an inner open region of the rectangular ring.

* * * * *